United States Patent
Chang et al.

(10) Patent No.: US 9,171,590 B2
(45) Date of Patent: Oct. 27, 2015

(54) SENSING MARGING EXPANDING SCHEME FOR MEMORY

(71) Applicant: NATIONAL TSING HUA UNIVERSITY, Hsinchu (TW)

(72) Inventors: Meng-Fan Chang, Taichung (TW); Jui-Jen Wu, Hsinchu County (TW); Yen-Chen Liu, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 114 days.

(21) Appl. No.: 14/226,206

(22) Filed: Mar. 26, 2014

(65) Prior Publication Data

US 2015/0279434 A1 Oct. 1, 2015

(51) Int. Cl.
*G11C 11/409* (2006.01)
*G11C 7/06* (2006.01)
*G11C 5/10* (2006.01)

(52) U.S. Cl.
CPC . *G11C 7/062* (2013.01); *G11C 5/10* (2013.01)

(58) Field of Classification Search
CPC ..................................................... G11C 11/409
USPC .......................................................... 365/207
See application file for complete search history.

(56) References Cited

U.S. PATENT DOCUMENTS

| 9,036,405 | B1* | 5/2015 | Giridhar | G11C 7/065 365/154 |
| 2001/0040814 | A1* | 11/2001 | Takashima | G11C 11/22 365/145 |
| 2003/0090925 | A1* | 5/2003 | Demange | G11C 11/22 365/145 |
| 2006/0044903 | A1* | 3/2006 | Forbes | G11C 11/4091 365/205 |
| 2010/0238744 | A1* | 9/2010 | Yano | G11C 7/12 365/189.11 |
| 2011/0043254 | A1* | 2/2011 | Shionoiri | G11C 7/062 327/52 |

* cited by examiner

*Primary Examiner* — Min Huang
(74) *Attorney, Agent, or Firm* — Li & Cai Intellectual Property (USA) Office

(57) ABSTRACT

A sensing margin expanding scheme for a memory and a method therefor is disclosed. A first terminal of a first capacitor is coupled to a bit line. A first terminal of a second capacitor is coupled to a reference voltage. In a first phase, the controller controls a first common switch and a second common switch to store the voltage difference between the bit line and the reference voltage to the first capacitor and the second capacitor. In a second phase, controlling the first common switch and the second common switch to open the first terminal of the first capacitor and the second terminal of the second capacitor and open the second terminal of the first capacitor and the first terminal of the second capacitor, and then coupling the second terminal of the first capacitor and the second terminal of the second capacitor to a common voltage.

18 Claims, 4 Drawing Sheets

SENSING MARGING EXPANDING SCHEME FOR MEMORY

BACKGROUND OF THE INVENTION

1. Field of the Invention

The instant disclosure relates to a memory; in particular, to a sensing margin expanding scheme for a memory.

2. Description of Related Art

In these years, the requirement of low power, high speed and high density memory increases, due to the industry growth of mobile device, medical electrical equipment, portable storage . . . etc. Sensing margin time of the memory is the key factor which may limit the access time of the memory.

FIG. 1 shows a diagram of a sensing margin for a conventional memory. A reference voltage VREF is provided for comparing with the bit line (BL) voltage of each cell of the memory. When the bit line capacitance (CBL) is coupled to a sensing amplifier the voltage of the bit line capacitance would drop from a standard VDD as the discharge-time passes. For example, the reference voltage VREF would be defined as larger than the bit line voltage as the discharge-time passes when the bit line store '1', and the bit line voltage would be lower than the reference voltage VREF as the discharge-time passes when the bit line store '0'. A sensing margin time of the bit line voltage is needed for obtaining a distinguishable voltage difference (compared with the offset of the sense amplifier) inputted to the sense amplifier. With low supply voltage, a sense amplifier needs more read margin against PVT variation. Conventional read scheme suffers from slow margin developing and thus has longer access time.

SUMMARY OF THE INVENTION

The object of the instant disclosure is to provide a sensing margin expanding scheme for a memory and a method therefor, in order to improve the sensing margin.

In order to achieve the aforementioned objects, according to an embodiment of the instant disclosure, a sensing margin scheme for a memory is offered. The sensing margin expanding scheme for a memory comprises a sense amplifier, a first capacitor, a second capacitor, a first common switch, a second common switch and a controller. The sense amplifier has a first input terminal, a second input terminal and an output terminal. A first terminal of the first capacitor is coupled to at least a bit line of the memory. A second terminal of the second capacitor is coupled to a pre-sense amplifier. A first terminal of the second capacitor is coupled to a reference voltage. A second terminal of the first capacitor is coupled to the pre-sense amplifier. The first common switch is coupled to the second terminal of the first capacitor and the first terminal of the second capacitor. The second common switch is coupled to the first terminal of the first capacitor and the second terminal of the second capacitor. The controller is coupled to the first common switch, the second common switch and the pre-sense amplifier. In a first phase, the controller controls the first common switch to short the second terminal of the first capacitor and the first terminal of the second capacitor and controls the second common switch to short the first terminal of the first capacitor and the second terminal of the second capacitor. In a second phase, the controller controls the first common switch to open the second terminal of the first capacitor and the first terminal of the second capacitor, and controls the second common switch to open the first terminal of the first capacitor and the second terminal of the second capacitor, and then controls the pre-sense amplifier to couple the second terminal of the first capacitor and the second terminal of the second capacitor to a common voltage.

In order to achieve the aforementioned objects, according to an embodiment of the instant disclosure, a method for expanding sensing margin of a memory is offered. The method for expanding sensing margin of a memory comprises coupling a first terminal of a first capacitor to a first input terminal of a sense amplifier and coupling a first terminal of a second capacitor to a second input terminal of the sense amplifier; shorting a second terminal of the first capacitor to the first terminal of the second capacitor and shorting a second terminal of the second capacitor to the first terminal of the first capacitor; providing the voltage of a bit line of the memory to the first terminal of the first capacitor and providing a reference voltage to the first terminal of the second capacitor, in order to store the voltage difference between the bit line and the reference voltage to the first capacitor and the second capacitor; opening the first terminal of the first capacitor and the second terminal of the second capacitor and opening the second terminal of the first capacitor and the first terminal of the second capacitor; and coupling the second terminal of the first capacitor and the second terminal of the second capacitor to a common voltage.

In summary, the margin expanding scheme is able to enlarge sensing margin by applying coupling capacitor which would store voltage difference between voltage of bit-line and bit-line reference voltage. It could improve about two times of the access time. Therefore, disclosed scheme can enlarge the read margin, and thus gains faster read access time in wide supply voltage range.

In order to further the understanding regarding the instant disclosure, the following embodiments are provided along with illustrations to facilitate the disclosure of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 1:
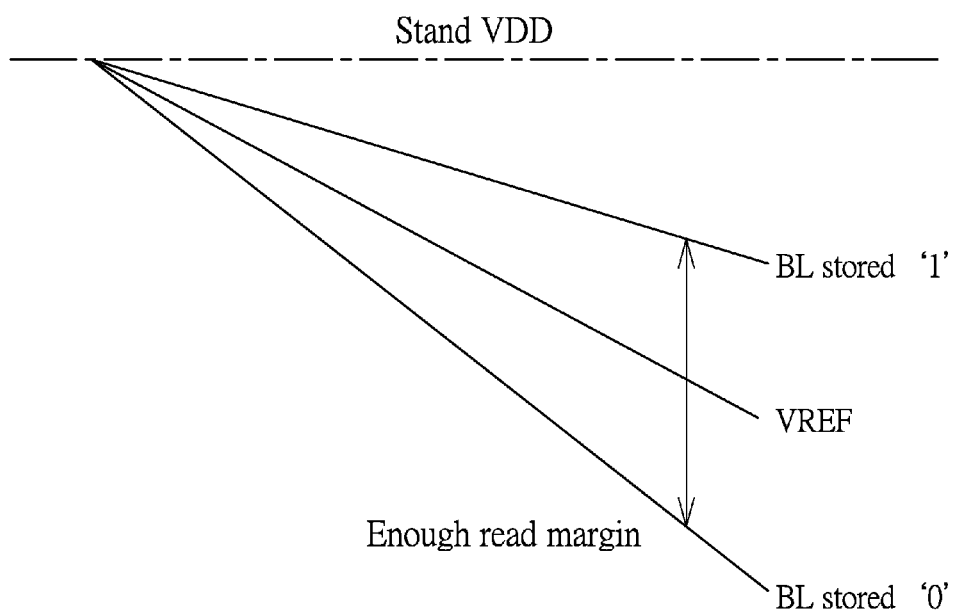
FIG. 1 shows a diagram of a sensing margin for a conventional memory.
Figure 2:
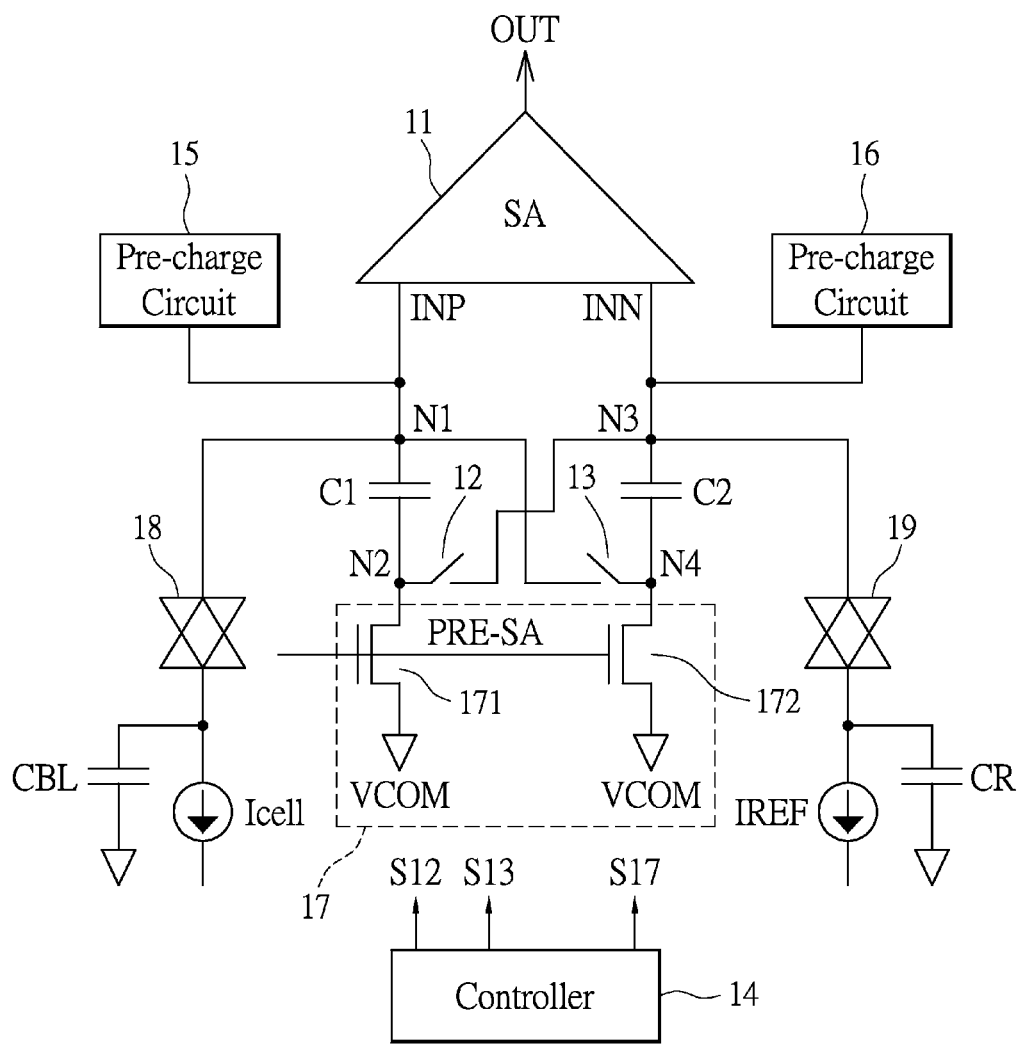
FIG. 2 shows a circuit block diagram of a sensing margin expanding scheme for a memory according to an embodiment of the instant disclosure.

Please refer to FIG. 2 showing a circuit block diagram of a sensing margin expanding scheme for a memory according to an embodiment of the instant disclosure. The scheme may be applied to the read circuit of the RRAM (Resistive Random-Access Memory) or SRAM (Static Random-Access Memory) for example, but the instant disclosure is not so restricted. The sensing margin expanding scheme for a memory may comprise a sense amplifier 11 (SA), a first capacitor C1, a second capacitor C2, a first common switch 12, a second common switch 13, a controller 14, a pre-charge circuit 15, a pre-charge circuit 16, a pre-sense amplifier 17, a first multiplexers 18, a second multiplexer 19, current sources Icell and IREF, and at least a reference capacitor CR (FIG. 2 only shows one reference capacitor CR for example). The memory has at least a memory cell each memory could be representing by a bit line capacitor CBL. Please also note that in order to describe the instant disclosure in an understandable and clear way, FIG. 2 only shows one bit line capacitor CBL. But the instant disclosure is not so restricted. The multiplexer 18 may be coupled to a plurality of bit lines. The multiplexer 18 multiplexes the bit line signals of the bit lines of the memory to the first terminal of the first capacitor C1. The sense amplifier 11 has a first input terminal INP, a second input terminal INN and an output terminal OUT. A first terminal N1 of the first capacitor C1 is coupled to at least a bit line (i.e. coupled to the bit line capacitor CBL) of the memory. In this embodiment, the first terminal N1 of the first capacitor C1 is coupled to the first multiplexer 18, and the first multiplexer 18 multiplexes the bit line signals of the bit lines of the memory to the first terminal N1 of the first capacitor C1. The first terminal N1 of the first capacitor C1 may be coupled to the pre-charge circuit 15. A second terminal N2 of the first capacitor C1 is coupled to the pre-sense amplifier 17. A first terminal N3 of the second capacitor C2 is coupled to a reference voltage VREF provided by the reference capacitor CR. In this embodiment, the first terminal N3 of the second capacitor C2 is coupled to the second multiplexer 19, and the second multiplexer 19 multiplexes a plurality of reference voltages VREF (FIG. 2 only shows one reference capacitor CR for providing the reference voltage VREF) to the first terminal N3 of the second capacitor C2. It is worth mentioning that for each bit line the reference voltage VREF may be different, but the instant disclosure is not restricted thereto. The first terminal N3 of the second capacitor C2 is coupled to the pre-charge circuit 16. A second terminal N4 of the second capacitor C2 is coupled to the pre-sense amplifier 17. The first capacitor C1 and the second capacitor C2 may have the same capacitance for having the same charge/discharge speed, but the instant disclosure is not so restricted.

The first common switch 12 is coupled to the second terminal N2 of the first capacitor C1 and the first terminal N3 of the second capacitor C2. The second common switch 13 is coupled to the first terminal N1 of the first capacitor C1 and the second terminal N4 of the second capacitor C2. The controller 14 is coupled to the first common switch 12, the second common switch 13 and the pre-sense amplifier 17 for outputting the control signals S12, S13 and S17 to the first common switch 12, the second common switch 13 and the pre-sense amplifier 17 respectively. The first capacitor C1 and the second capacitor C2 coupling with the first common switch 12 and the second common switch 13 may arranged in a symmetry structure as shown in FIG. 2.

The pre-sense amplifier 17 may comprise a third common switch 171 and a fourth common switch 172. Specifically, the second terminal N2 of the first capacitor C1 is coupled to the third common switch 171 of the pre-sense amplifier 17 controlled by the control signal S17 of the controller 14. The second terminal N4 of the second capacitor C2 is coupled to a fourth common switch 172 of the pre-sense amplifier 17 controlled by the control signal S17 of the controller 14. The scheme operates in a first phase and a consequence second phase for developing an enlarged read margin.

Figure 3:
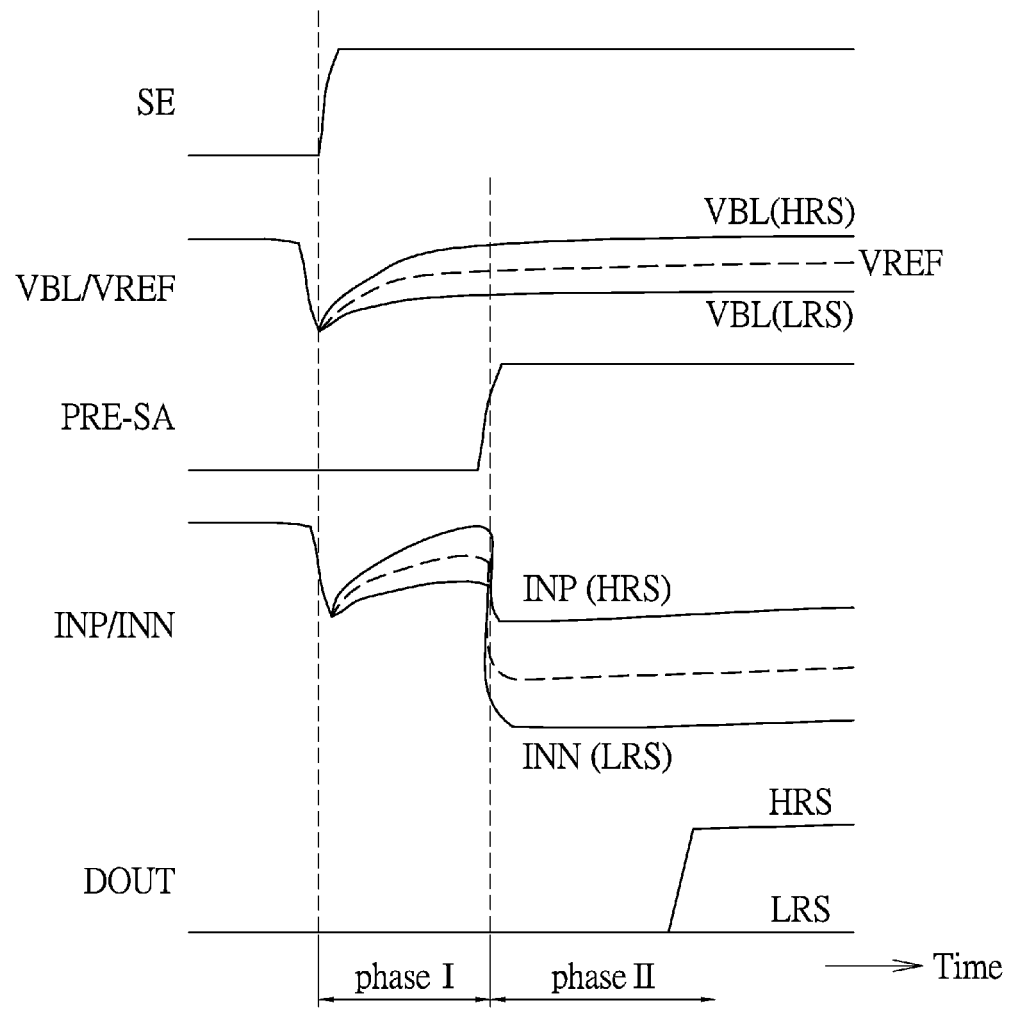
FIG. 3 shows a curve diagram of the operation of the sensing margin expanding scheme of FIG. 2.

Please refer to FIG. 3 in conjunction with FIG. 2, FIG. 3 shows a curve diagram of the operation of the sensing margin expanding scheme of FIG. 2. In a stand by phase before the time of phase I, the sensing signal SE is in a low voltage level (OFF) and no voltage difference is provided to the first input terminal INP and the second input terminal INN of the sense amplifier 11. Then, just before the time period of phase (i.e. before the sensing signal SE raise to a high voltage level (ON)), the pre-charge circuit 15 and the pre-charge circuit 16 respectively charge the node of the first input terminal INP and the node of the second input terminal INN to a pre-charge voltage level for initializing the operation. In the first phase (phase I), the controller 14 controls (by outputting the control signal S12) the first common switch 12 to short the second terminal N2 of the first capacitor C1 and the first terminal N3 of the second capacitor C2 and controls (by outputting the control signal S13) the second common switch 13 to short (i.e. to connect) the first terminal N1 of the first capacitor C1 and the second terminal N4 of the second capacitor C2. Therefore, a voltage difference between the bit line (applied to the first input terminal INP) and the reference voltage (applied to the second input terminal INN) is developed in phase I. Meanwhile, aforementioned the voltage difference is stored in the first capacitor C1 and the second capacitor C2 at the same time. If the voltage of the bit line is larger than the reference voltage VREF, a positive voltage difference (VBL−VREF) across the first terminal N1 and the second terminal N2 of the first capacitor C1 is made, and a negative voltage difference (VREF−VBL) across the first terminal N3 and the second terminal N4 of the second capacitor C2 is made. The time period of the aforementioned first phase (phase I) is for developing a reliable voltage from the bit line (or also the reference voltage) could be designed as short as possible in practical applications. In one embodiment, the time period of the phase I may be defined as the time period when the developed voltage difference (VBL−VREF) is larger than the offset voltage of the sense amplifier 11.

Then, in the second phase (phase II), the controller 14 controls the first common switch 12 to open (i.e. to disconnect) the second terminal N2 of the first capacitor C1 and the first terminal N3 of the second capacitor C2, and controls the second common switch 13 to open the first terminal N1 of the first capacitor C1 and the second terminal N4 of the second capacitor C2, and then controls the pre-sense amplifier 17 to couple the second terminal N2 of the first capacitor C1 and the second terminal N4 of the second capacitor C2 to a common voltage VCOM. In other words, the first common switch 12 and the second common switch 13 are turned off, and the control signal S17 (i.e. the voltage of PRE−SA shown in FIG. 3) with a high voltage level is provided to the third common switch 171 and the second common switch 172 for turning on the third common switch 171 and the second common switch 172. Thus, the voltages of the second terminal N2 of the first capacitor C1 and the second terminal N4 of the second capacitor C2 could be changed to a common voltage VCOM. Therefore, the voltage of the first terminal N1 of the first capacitor C1 may be changed to VCOM+VBL−VREF, and the voltage of the first terminal N3 of the second capacitor C2 may be changed to VCOM+VREF−VBL. As a consequence, the voltage difference between the first input terminal INP and the second input terminal INN is 2*(VBL−VREF) which is representing two times of the voltage difference between the bit line and the reference voltage. As a result, the sensing time of the same sensing margin of the sense amplifier would be reduced to a half time compared to the original sensing time. As shown in FIG. 3, the voltage difference between the first input terminal INP and the second input terminal INN in the phase II is double of the voltage difference VBL−VREF. An output digital circuit connected with the output terminal OUT of the sense amplifier 11 could output (DOUT) the corresponding sensing result HRS or LRS. The sensing result HRS is caused by the sensed voltage VBL(HRS) provided to the first input terminal INP, and the sensing result LRS is caused by the sensed voltage VBL(LRS).

Figure 4:
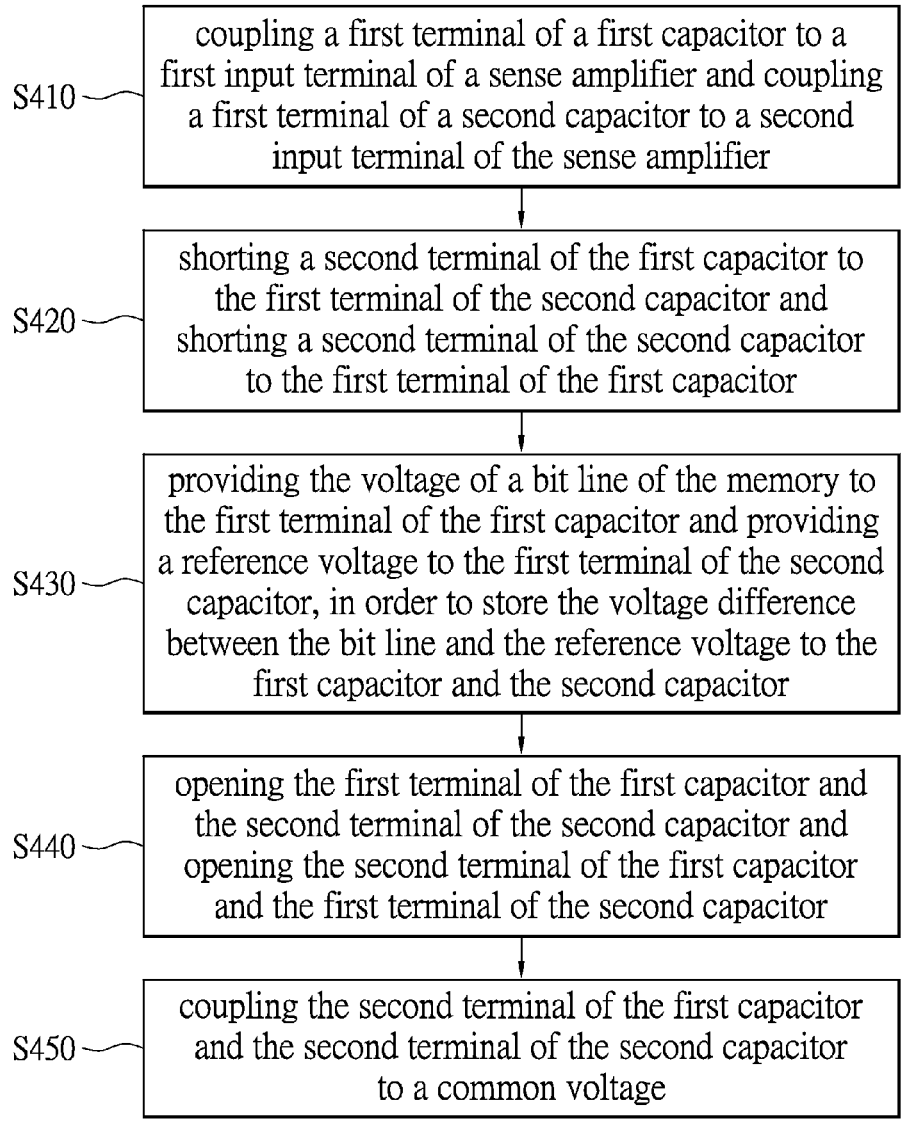
FIG. 4 shows a flow chart of a method for expanding sensing margin of a memory according to an embodiment of the instant disclosure.

Please refer to FIG. 4 in conjunction with FIG. 2 and FIG. 3, FIG. 4 shows a flow chart of a method for expanding sensing margin of a memory according to an embodiment of the instant disclosure. The method for expanding sensing margin of a memory may be applied to the circuit disclosed in FIG. 2. The method may comprise following steps. First, in step S410, coupling a first terminal (N1) of a first capacitor (C1) to a first input terminal (INP) of a sense amplifier (11) and coupling a first terminal (N3) of a second capacitor (C2) to a second input terminal (INN) of the sense amplifier (11). Then, in step S420, shorting a second terminal (N2) of the first capacitor (C1) to the first terminal (N3) of the second capacitor (C2) and shorting a second terminal (N4) of the second capacitor (C2) to the first terminal (N1) of the first capacitor (C1). Then, in step S430, providing the voltage of a bit line (VBL) of the memory to the first terminal (N1) of the first capacitor (C1) and providing a reference voltage (VREF) to the first terminal (N3) of the second capacitor (C2), in order to store the voltage difference (VBL−VREF) between the bit line and the reference voltage to the first capacitor (C1) and the second capacitor (C2). Then, in step S440, opening the first terminal (N1) of the first capacitor (C1) and the second terminal (N4) of the second capacitor (C2) and opening the second terminal (N2) of the first capacitor (C1) and the first terminal (N3) of the second capacitor (C2). Then, in step S450, coupling the second terminal (N2) of the first capacitor (C1) and the second terminal (N4) of the second capacitor (C2) to a common voltage (VCOM). Thus, the voltage difference between the first input terminal (INP) and the second input terminal (INN) would be 2*(VBL−VREF). Additionally, the method may further comprises arranging the first capacitor (C1) and the second capacitor (C2) coupling with the first common switch (12) and the second common switch (13) in a symmetry structure for reducing mismatch due to layout.

According to above descriptions, the margin expanding scheme is able to enlarge sensing margin by applying coupling capacitor which would store voltage difference between voltage of bit-line and bit-line reference voltage. It could improve about two times of the access time. Using this scheme which applicable to both RRAM-like and SRAM-like bit-line developing way to expand read margin. Therefore, disclosed scheme can enlarge the read margin, and thus gains faster read access time in wide supply voltage range. This scheme is applicable to both RRAM-like and SRAM-like bit line (BL) developing way to expand read margin. Additionally, in order to reduce possible mismatch caused of the circuit, the circuit layout of the sensing margin expanding scheme could be arranged to a symmetry structure due to the symmetrical circuit scheme.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A sensing margin expanding scheme for a memory, comprising:
 a sense amplifier, having a first input terminal, a second input terminal and an output terminal;
 a first capacitor, a first terminal of the first capacitor coupled to at least a bit line of the memory, a second terminal of the first capacitor coupled to a pre-sense amplifier;
 a second capacitor, a first terminal of the second capacitor coupled to a reference voltage, a second terminal of the second capacitor coupled to the pre-sense amplifier;
 a first common switch, coupled to the second terminal of the first capacitor and the first terminal of the second capacitor;
 a second common switch, coupled to the first terminal of the first capacitor and the second terminal of the second capacitor; and
 a controller, coupled to the first common switch, the second common switch and the pre-sense amplifier;
 wherein, in a first phase, the controller controls the first common switch to short the second terminal of the first capacitor and the first terminal of the second capacitor and controls the second common switch to short the first terminal of the first capacitor and the second terminal of the second capacitor;
 wherein, in a second phase, the controller controls the first common switch to open the second terminal of the first capacitor and the first terminal of the second capacitor, and controls the second common switch to open the first terminal of the first capacitor and the second terminal of the second capacitor, and then controls the pre-sense amplifier to couple the second terminal of the first capacitor and the second terminal of the second capacitor to a common voltage.

2. The sensing margin expanding scheme according to claim 1, wherein the first capacitor and the second capacitor coupling with the first common switch and the second common switch are arranged in a symmetry structure.

3. The sensing margin expanding scheme according to claim 1, wherein the first terminal of the first capacitor is coupled to a pre-charge circuit.

4. The sensing margin expanding scheme according to claim 1, wherein the first terminal of the second capacitor is coupled to a pre-charge circuit.

5. The sensing margin expanding scheme according to claim 1, wherein the first capacitor and the second capacitor have the same capacitance.

6. The sensing margin expanding scheme according to claim 1, wherein the second terminal of the first capacitor is coupled to a third common switch of the pre-sense amplifier controlled by the controller.

7. The sensing margin expanding scheme according to claim 1, wherein the second terminal of the second capacitor is coupled to a fourth common switch of the pre-sense amplifier controlled by the controller.

8. The sensing margin expanding scheme according to claim 1, wherein the first terminal of the first capacitor is coupled to a first multiplexer, the first multiplexer multiplexes the bit line signals of the bit lines of the memory to the first terminal of the first capacitor.

9. The sensing margin expanding scheme according to claim 1, wherein the first terminal of the second capacitor is coupled to a second multiplexer, the second multiplexer multiplexes a plurality of reference voltages to the first terminal of the second capacitor.

10. A method for expanding sensing margin of a memory, comprising:
 coupling a first terminal of a first capacitor to a first input terminal of a sense amplifier and coupling a first terminal of a second capacitor to a second input terminal of the sense amplifier;

shorting a second terminal of the first capacitor to the first terminal of the second capacitor and shorting a second terminal of the second capacitor to the first terminal of the first capacitor;

providing the voltage of a bit line of the memory to the first terminal of the first capacitor and providing a reference voltage to the first terminal of the second capacitor, in order to store the voltage difference between the bit line and the reference voltage to the first capacitor and the second capacitor;

opening the first terminal of the first capacitor and the second terminal of the second capacitor and opening the second terminal of the first capacitor and the first terminal of the second capacitor; and coupling the second terminal of the first capacitor and the second terminal of the second capacitor to a common voltage.

11. The method for expanding sensing margin of a memory according to claim 10, further comprising:

arranging the first capacitor and the second capacitor coupling with the first common switch and the second common switch in a symmetry structure.

12. The method for expanding sensing margin of a memory according to claim 10, wherein the first capacitor and the second capacitor have the same capacitance.

13. The method for expanding sensing margin of a memory according to claim 10, wherein the first terminal of the first capacitor coupling to a pre-charge circuit.

14. The method for expanding sensing margin of a memory according to claim 10, wherein the first terminal of the second capacitor coupling to a pre-charge circuit.

15. The method for expanding sensing margin of a memory according to claim 10, wherein the second terminal of the first capacitor is coupled to a third common switch of the pre-sense amplifier controlled by the controller.

16. The method for expanding sensing margin of a memory according to claim 10, wherein the second terminal of the second capacitor is coupled to a fourth common switch of the pre-sense amplifier controlled by the controller.

17. The method for expanding sensing margin of a memory according to claim 10, wherein the first terminal of the first capacitor is coupled to a first multiplexer, the first multiplexer multiplexes the bit line signals of the bit lines of the memory to the first terminal of the first capacitor.

18. The method for expanding sensing margin of a memory according to claim 10, wherein the first terminal of the second capacitor is coupled to a second multiplexer, the second multiplexer multiplexes a plurality of reference voltages to the first terminal of the second capacitor.

* * * * *